US007993704B2

(12) United States Patent
Raybould et al.

(10) Patent No.: US 7,993,704 B2
(45) Date of Patent: Aug. 9, 2011

(54) PROTECTIVE COATING SYSTEMS FOR GAS TURBINE ENGINE APPLICATIONS AND METHODS FOR FABRICATING THE SAME

(75) Inventors: Derek Raybould, Denville, NJ (US); Paul J. Mravcak, Simpsonville, SC (US); Christian Delacruz, Parsippany, NJ (US)

(73) Assignee: Honeywell International Inc., Morristown, NJ (US)

( * ) Notice: Subject to any disclaimer, the term of this patent is extended or adjusted under 35 U.S.C. 154(b) by 861 days.

(21) Appl. No.: 11/950,891

(22) Filed: Dec. 5, 2007

(65) Prior Publication Data

US 2009/0148628 A1 Jun. 11, 2009

(51) Int. Cl.
*C23C 16/22* (2006.01)
*C23C 16/40* (2006.01)
*B05D 3/02* (2006.01)

(52) U.S. Cl. ............. 427/255.21; 427/255.7; 427/376.2; 427/376.4

(58) Field of Classification Search ........................ None
See application file for complete search history.

(56) References Cited

U.S. PATENT DOCUMENTS

| | | | |
|---|---|---|---|
| 5,660,885 | A | 8/1997 | Hasz et al. |
| 5,683,825 | A | 11/1997 | Bruce et al. |
| 5,792,521 | A | 8/1998 | Wortman |
| 6,103,386 | A | 8/2000 | Raybould |
| 6,485,791 | B1 | 11/2002 | Nagaraj |
| 6,558,814 | B2 | 5/2003 | Spitsberg et al. |
| 6,630,199 | B1 | 10/2003 | Austin et al. |
| 6,630,200 | B2 | 10/2003 | Wang et al. |
| 6,699,607 | B1 | 3/2004 | Spitsberg |
| 6,733,908 | B1 | 5/2004 | Lee et al. |
| 6,740,364 | B2 | 5/2004 | Lau et al. |
| 6,875,464 | B2 | 4/2005 | Ruund et al. |
| 7,087,266 | B2 | 8/2006 | Darolia et al. |
| 7,175,888 | B2 | 2/2007 | Johnson et al. |
| 7,282,271 | B2 | 10/2007 | Strangman et al. |
| 2003/0003328 | A1 | 1/2003 | Spitsberg et al. |
| 2003/0027012 | A1 | 2/2003 | Spitsberg et al. |
| 2005/0042461 | A1 | 2/2005 | Li et al. |
| 2005/0112381 | A1 | 5/2005 | Raybould et al. |
| 2005/0282020 | A1 | 12/2005 | Stowell et al. |
| 2006/0121295 | A1 | 6/2006 | Boutwell et al. |
| 2006/0166018 | A1 | 7/2006 | Spitsberg et al. |
| 2006/0166019 | A1 | 7/2006 | Spitsberg et al. |
| 2006/0280953 | A1 | 12/2006 | Hazel et al. |
| 2006/0280963 | A1 | 12/2006 | Hazel et al. |
| 2007/0172703 | A1 | 7/2007 | Freling et al. |
| 2007/0224411 | A1 | 9/2007 | Hazel et al. |

FOREIGN PATENT DOCUMENTS

EP 1685083 B1 12/2007

OTHER PUBLICATIONS

EP Search Report—08170328.2-2122 dated Jun. 2, 2009.

*Primary Examiner* — Timothy M Speer
(74) *Attorney, Agent, or Firm* — Ingrassia Fisher & Lorenz

(57) ABSTRACT

Protective coating systems for gas turbine engine applications and methods for fabricating such protective coating systems are provided. An exemplary method of fabricating a protective coating system on a substrate comprises forming a bond coating on the substrate, forming a silicate layer on the bond coating, forming a thermal barrier coating overlying the silicate layer, and heating the thermal barrier coating.

19 Claims, 8 Drawing Sheets

PROTECTIVE COATING SYSTEMS FOR GAS TURBINE ENGINE APPLICATIONS AND METHODS FOR FABRICATING THE SAME

FIELD OF THE INVENTION

The present invention generally relates to thermal barrier coatings for gas turbine engine applications and methods for fabricating such thermal barrier coatings, and more particularly relates to protective coating systems having improved bonding to components of gas turbine engines and methods for fabricating such protective coating systems.

BACKGROUND OF THE INVENTION

Ceramic thermal barrier coatings (TBCs) have received increased attention for advanced gas turbine engine applications. TBCs may be used to protect the components of a gas turbine engine that are subjected to extremely high temperatures. Typical TBCs include those formed of yttria stabilized zirconia (also referred to as yttria stabilized zirconium oxide) (YSZ) and ytrria stabilized hafnia (YSH). TBC systems have been aggressively designed for the thermal protection of engine hot section components, thus allowing significant increases in engine operating temperatures, fuel efficiency and reliability. However, the increases in engine temperature can raise considerable coating durability issues. The development of next generation lower thermal conductivity and improved thermal stability TBCs thus becomes important for advancing the ultra-efficient and low emission gas turbine engine technology.

An effective TBC has a low thermal conductivity and strongly adheres to the substrate to which it is bonded under use conditions. To promote adhesion and to extend the service life of a TBC, an oxidation-resistant bond coating is commonly employed. Bond coatings typically are in the form of overlay coatings such as MCrAlX, where M is a transition metal such as iron, cobalt, and/or nickel, and X is yttrium or another rare earth element. Bond coatings also can be diffusion coatings such as a simple aluminide of platinum aluminide. When a diffusion bond coating is applied to a substrate, a zone of interdiffusion forms between the bond coat and the substrate. During exposure of ceramic TBCs to high temperatures, such as during ordinary service use thereof, bond coats of the type described above oxidize to form a tightly adherent alumina scale that protects the underlying structure from catastrophic oxidation. The TBC is bonded to the bond coat by this alumina scale. The quality of the scale therefore is extremely important. During use, the alumina scale slowly oxidizes and grows in thickness at the extremely high use temperatures. This growth increases the stress on the TBC due to thermal expansion mismatch between the ceramic TBC and the metal substrate and the bond coat.

Partial loss of cohesion between a TBC and the underlying bond coating may contribute to TBC spalling. When this partial loss of cohesion occurs, alumina growth stresses and alumina-superalloy thermal expansion mismatch stresses within the thermally grown oxide, which occur during thermal transients, may form microbuckles in the thermally grown oxide at the TBC-bond coating interface. Once initiated, interfacial microbuckles continue to grow at operational temperatures in the range of 900 to 1150° C. because bond coatings have insufficient creep-strength to constrain the area-growth of the thermally grown oxide scale. The problem is compounded if the bond coating does not have an optimal chemistry or comprises impurities, such as sulfur or chlorine, that accelerate the oxidation of the bond coating and hence shorten the TBC life.

Accordingly, it is desirable to provide protective coating systems for gas turbine engine applications that exhibit long life and high reliability. It also is desirable to provide protective coating systems that have a low rate of oxidation and hence growth in thickness of the alumina scale so that thermal mismatch stresses do not increase during use. In addition, it is desirable to provide protective coating systems that minimize or eliminate TBC spalling. It is also desirable to provide methods for fabricating such protective coating systems. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method of fabricating a protective coating system on a substrate is provided in accordance with an exemplary embodiment of the present invention. The method comprises forming a bond coating on the substrate, forming a silicate layer on the bond coating, forming a thermal barrier coating overlying the silicate layer, and heating the thermal barrier coating.

A method of fabricating a protective coating system on a substrate is provided in accordance with another exemplary embodiment of the present invention. The method comprises forming a bond coating on the substrate, forming a silicon dioxide layer on the barrier layer, depositing a thermal barrier coating on the silicon dioxide layer, and heating the substrate so that the silicon dioxide layer forms a silicate layer disposed between the bond coating and the thermal barrier coating.

A protective coating system for a substrate is provided in accordance with another exemplary embodiment of the present invention. The protective coating system comprises a bond coating disposed on the substrate, a thermal barrier coating overlying the bond coating, and a silicate layer interposed between the thermal barrier coating and the bond coating.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

The present invention includes a protective coating system for a variety of substrates, including gas turbine and aero-engine components. The protective coating system has both thermal barrier properties and improved bonding to an underlying substrate. In one exemplary embodiment, the protective coating system includes an intermediate silicate layer that improves bonding between a bond coating disposed on the substrate and an overlying thermal barrier coating. The silicate layer can result from the reaction of a silicon dioxide ($SiO_2$) layer that is disposed between the bond coating and the thermal barrier coating during fabrication. In another exemplary embodiment, in addition to the silicon dioxide layer, the silicate layer can result from the reaction of a barrier layer that also is disposed between the bond coating and the thermal barrier coating during fabrication. The barrier layer minimizes the preferential reaction of the silicon dioxide with the bond coating at the expense of the thermal barrier coating.

Figure 1:
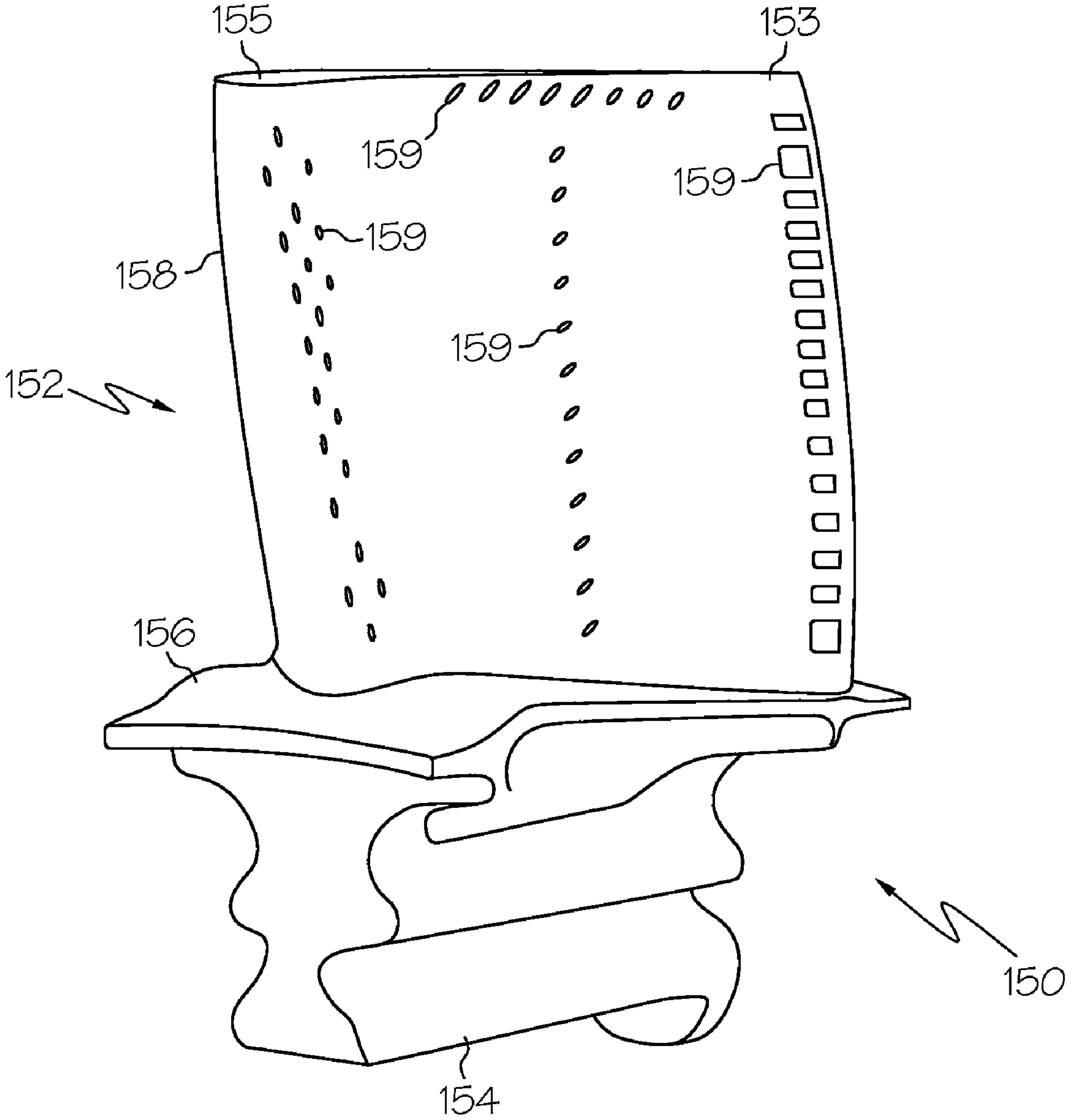
FIG. 1 is a schematic illustration of a gas turbine blade upon which an exemplary embodiment of a protective coating system of the present invention can be disposed.

FIG. 1 illustrates a superalloy blade 150 that is exemplary of the types of components or substrates that are used in turbine engines, although turbine blades commonly have different shapes, dimensions and sizes depending on gas turbine engine models and applications. However, this invention is not restricted to such substrates and may be utilized on many other substrates requiring thermal barrier protection, including other components of gas turbine engines exposed to high temperature gases. Nickel-based superalloys are just one class of materials that are commonly used to manufacture turbine engine blades, although other classes of materials include cobalt-based superalloys, titanium-based superalloys, nickel aluminides including NiAl, alumina fiber/alumina silicate matrix composites, silicon carbide fiber/silicon carbide matrix composites, alumina fiber/refractory metal matrix composites, alumina fiber/MCrAlY matrix composites, refractory metal fiber/MCrAlY matrix composites, alumina fiber/NiAl matrix composites, silicon carbide fiber/gamma TiAl matrix composites, refractory metal fiber/NiAl matrix composites, carbon fiber/carbon matrix composites, alumina fiber/TiAl alloy matrix composites, silicon carbide fiber/alumna matrix composites, silicon carbide fiber/silicon nitride matrix composites and other materials systems. The illustrated blade 150 has an airfoil portion 152 including a pressure surface 153, an attachment or root portion 154, a leading edge 158 including a blade tip 155, and a platform 156. The blade 150 may be formed with a non-illustrated outer shroud attached to the tip 155. The blade 150 may have non-illustrated internal air-cooling passages that remove heat from the turbine airfoil. After the internal air has absorbed heat from the superalloy, the air is discharged into a combustion gas flow path through passages 159 in the airfoil wall.

Figure 2:
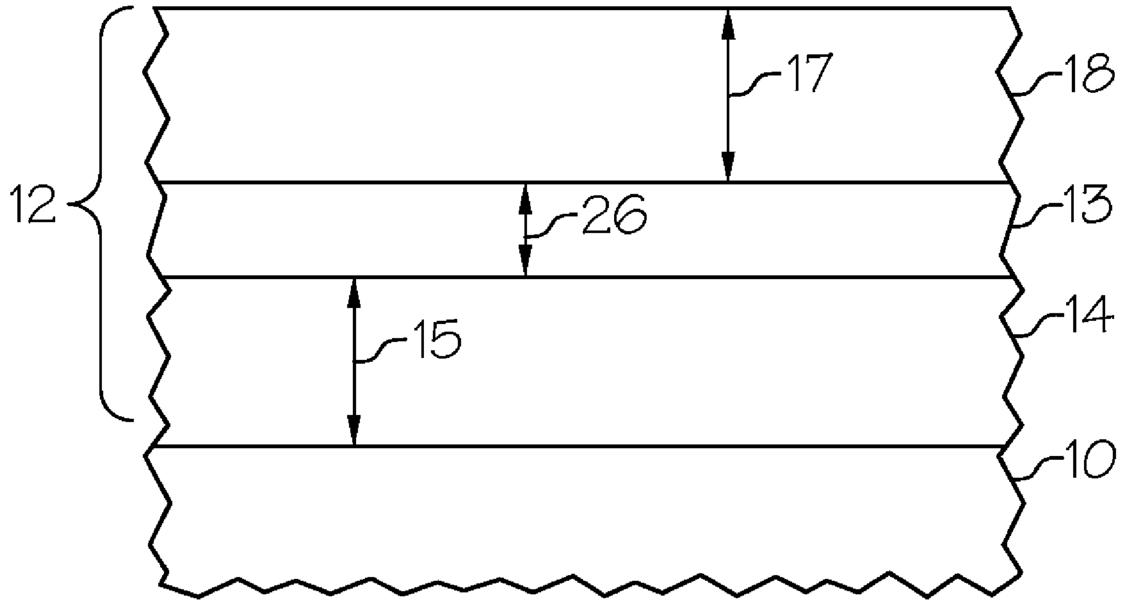
FIG. 2 is a cross-sectional view of a protective coating system in accordance with an exemplary embodiment of the present invention.

FIG. 2 is a cross-sectional view of a substrate 10 upon which is disposed a protective coating system 12 in accordance with an exemplary embodiment of the present invention. The substrate 10 may be, for example, a turbine blade such as turbine blade 150 of FIG. 1. The protective coating system 12 overlies the substrate 10 and any intermediate layers, and is formed of a bond coating 14, a thermal barrier coating 18, and an intermediate silicate layer (—$SiO_x$) 13. In one exemplary embodiment, the bond coating is a simple diffusion aluminide. In another embodiment, the bond coating is a more complex diffusion aluminide that includes another layer such as another metal layer. In one embodiment, the other metal layer is a platinum layer. In another exemplary embodiment, the bond coating 14 is an overlay coating known as an MCrAlX coating, wherein M is cobalt, iron, and/or nickel, or an oxidation resistant intermetallic, such as diffusion aluminide, platinum aluminide, or an active element-modified aluminide. In some bond coatings, the chromium can be omitted. The X is hafnium, zirconium, yttrium, tantalum, rhenium, ruthenium, palladium, platinum, silicon, titanium, boron, carbon, or combinations thereof. Some examples of MCrAlX compositions include NiAlCrZr and NiAlZr. Thermal barrier coating 18 may comprise, for example, a stabilized zirconia-based thermal barrier coating, such as yttria stabilized zirconia (YSZ), or a stabilized hafnia-based thermal barrier coating, such as yttria stabilized hafnia (YSH).

Silicate layer 13 is disposed between bond coating 14 and thermal barrier coating 18. As discussed in more detail below, the silicate layer 13 bonds with the bond coating 14. This bonding reduces the effect of impurities in the bond coating and minimizes the growth of oxide on the bond coating, thus improving the adherence of the thermal barrier coating 18 to the bond coating 14 and reducing the thermal mismatch stress due to growth of the alumina scale and, hence, improving the life of the protective coating system 12.

Figure 3:
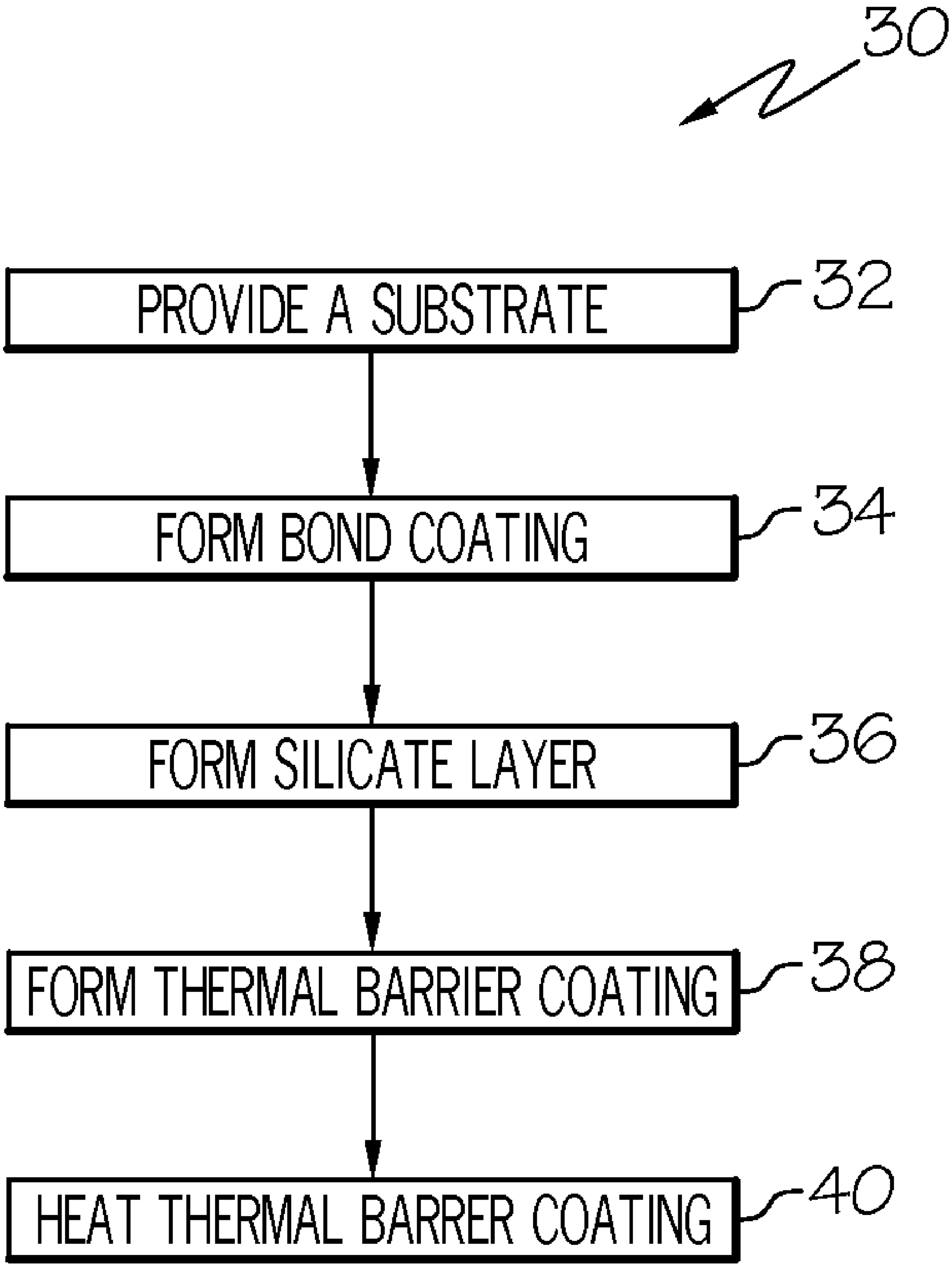
FIG. 3 is a flowchart of a method for fabricating a protective coating system, such as the protective coating system of FIG. 2, in accordance with an exemplary embodiment of the present invention.

Having described the general structure of the protective coating system 12, a method 30 for fabricating a protective coating system, such as protective coating system 12 of FIG. 2, shall be described. Referring to FIG. 3, the method 30 begins with the step of providing a substrate 10 (step 32). As described above, the substrate may be a turbine blade, or any other turbine component such as, for example, a vane or a shroud, that is subjected to high gas temperatures. The substrate may comprise nickel-based superalloys, cobalt-based superalloys, titanium-based superalloys, nickel aluminides, including NiAl, and any of the other materials or material systems discussed above for fabrication of substrate 10 of FIG. 2. A bond coating, such as bond coating 14 of FIG. 2, then is formed on the substrate (step 34). The bond coating may comprise any of the materials described above for bond coating 14. The bond coating may be deposited using various known deposition techniques such as, for example, simple over-the-pack aluminizing, electroplating, electron beam physical vapor deposition (EB-PVD), chemical vapor deposition (CVD), low pressure spray, and cold spraying and may be deposited to a thickness, indicated by double-headed arrow 15, in the range of about 25 μm (about 1 mil) to about 150 μm (about 6 mils). After formation, the exposed surface of the bond coating is cleaned, such as by grit blasting, to remove any oxides or contaminants that have formed on or adhered to the bond coating surface.

The method continues with the formation of a silicate layer, such as silicate layer 13 of FIG. 2 (step 36). In accordance with one exemplary embodiment, the silicate layer may be directly formed on the bond coating using techniques such as CVD and plasma vapor deposition (PVD). In one embodiment, the silicate layer is a silicon dioxide layer. In another embodiment, the silicate layer is a zirconium silicate layer. Preferably, the silicate layer is formed on the bond coating by EB-PVD prior to the formation of the thermal barrier coating by EB-PVD. In this regard, an ingot of the desired silicate is disposed in an EB-PVD chamber proximate to a zirconia (zirconium oxide) ingot and is evaporated using e-beam guns. Once the silicate layer is formed on the bond coating, the e-beam guns are directed to the zirconia ingot and formation of a TBC is executed using the normal parameters. The thickness of the silicate, as indicated by double-headed arrow 26 of FIG. 2, is no greater than about 12 μm (about 0.4 mils). Preferably, the thickness 26 is about 1 μm (about 0.04 mils).

The method continues with the formation of a thermal barrier coating, such as thermal barrier coating 18 of FIG. 2 (step 38). In one exemplary embodiment, the thermal barrier coating is yttria stabilized zirconium oxide (YSZ) that is deposited on the silicate layer by plasma spraying, PVD or EB-PVD. In another exemplary embodiment, the thermal barrier coating is yttria stabilized hafnium oxide (YSH) that is deposited on the silicate layer by plasma spraying or EB-PVD. A thickness of thermal barrier coating 18, indicated by double-headed arrow 17 of FIG. 2, may vary according to design parameters and may be, for example, between about 50 and about 1000 μm, and typically between about 100 and 250 μm. After formation, the thermal barrier coating is heated. Preferably, the thermal barrier coating is heated to a temperature in the range of about 900° C. to about 1100° C. for about 0.5 to 12 hours so that the silicate layer 13 reacts with the thermal barrier coating (step 40). The silicate layer also reacts with the alumina of the bond coating. The silicate layer 13 inhibits the oxidation of the bond coating and strongly bonds the thermal barrier coating to the bond coating, thus minimizing failure of the thermal bond coating.

Figure 4:
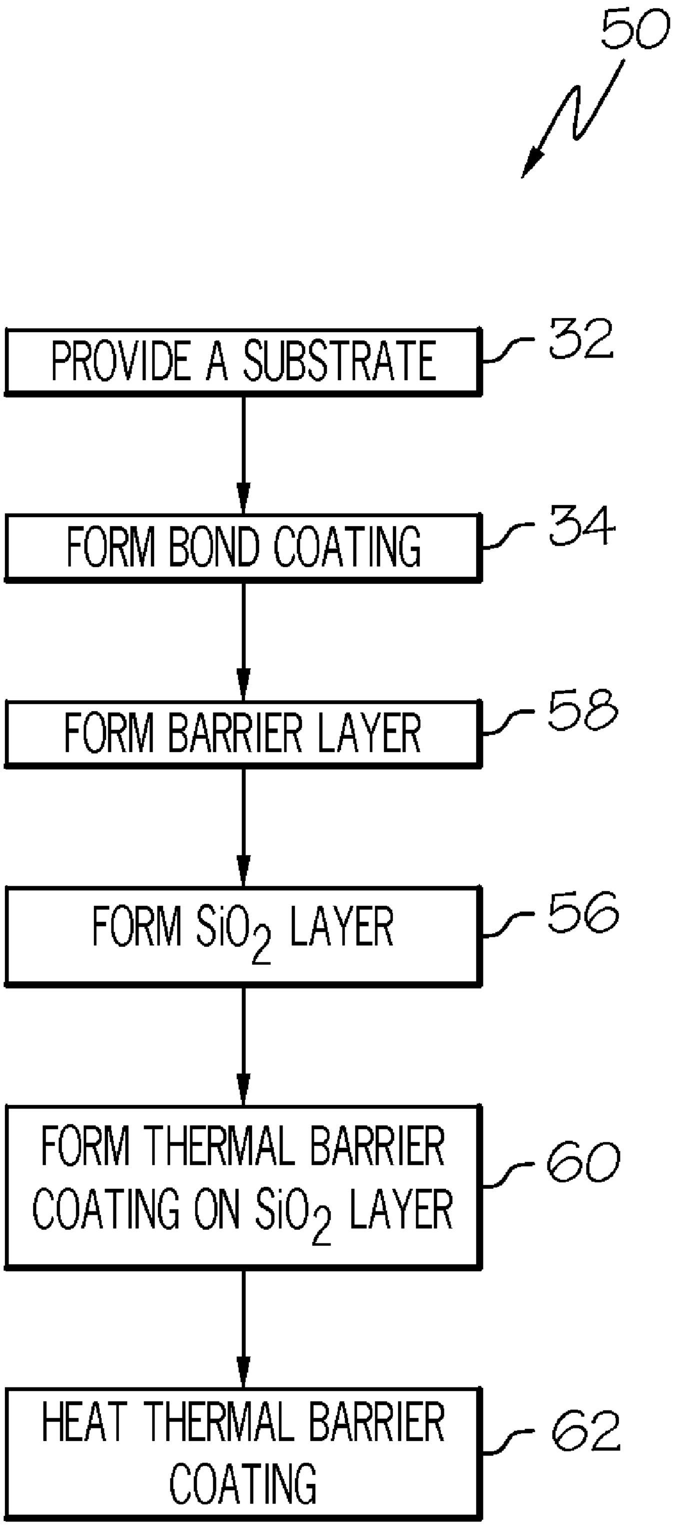
FIG. 4 is a flowchart of a method for fabricating a protective coating system, such as the protective coating system of FIG. 2, in accordance with another exemplary embodiment of the present invention.
Figure 5:
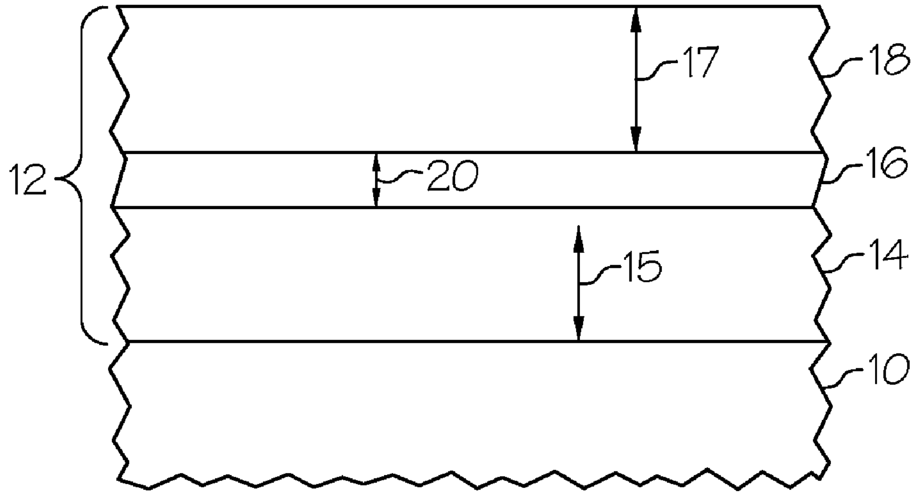
FIG. 5 is a cross-sectional view of a silicon dioxide layer disposed between a bond coating and a thermal barrier coating, in accordance with an exemplary embodiment of the method of FIG. 6.
Figure 6:
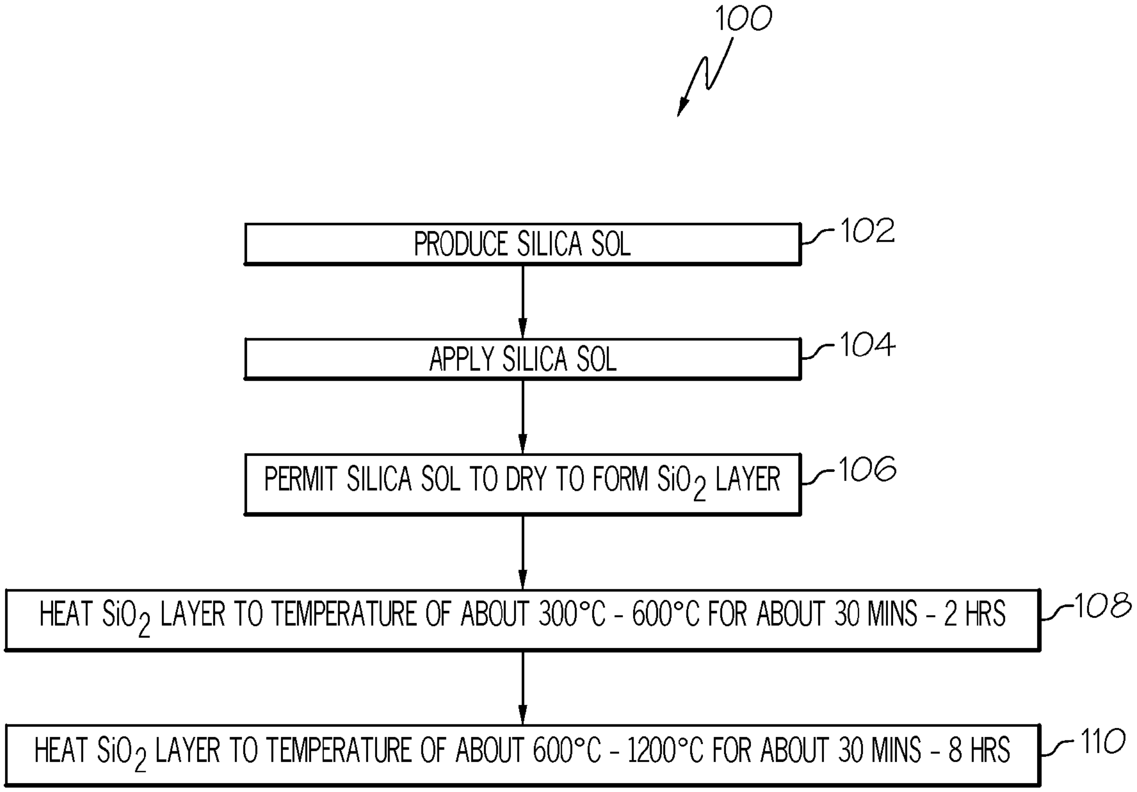
FIG. 6 is a flowchart of a method for fabricating the silicon dioxide layer of FIG. 5, in accordance with an exemplary embodiment of the present invention.

Referring to FIG. 4, in another exemplary embodiment, a method 50 for fabricating a protective coating system, such as protective coating system 12 of FIG. 2, shall be described. Referring to FIGS. 4 and 5, the method 50 begins with the step of providing a substrate 10 (step 32) and forming a bond coating 14 on the substrate (step 34), which steps were previously described with respect to FIG. 3. The method 50 continues with the formation of a $SiO_2$ layer 16 overlying the bond coating 14 (step 56). In accordance with one exemplary embodiment of the present invention, the $SiO_2$ layer is formed using a sol-gel process. A method 100 for producing a $SiO_2$ layer using a sol-gel process is illustrated in FIG. 6. Referring momentarily to FIG. 6, a silicon alkoxide, such as tetraethoxysilane, is mixed with an anhydrous solvent, such as alcohol, to produce a silica sol (step 102). The silica sol is applied to the bond coating using any suitable technique, such as spraying, painting, dip-coating or the like, so that a layer of silica, with minimal and preferably no air bubbles, is disposed on the bond coating (step 104). The silica layer is permitted to dry at a temperature in the range of about 4° C. to about 70° C. in an environment of about 10 to about 90% humidity, thereby forming a $SiO_2$ layer overlying the bond coating (step 106). The $SiO_2$ layer 16 has a thickness, indicated by double-headed arrow 20, of no greater than about 12 μm (about 0.4 mil). Preferably, the thickness is less than about 5 μm (about 0.2 mil) and, more preferably, is about 1 μm (about 0.04 mil). Once dried, the $SiO_2$ layer is baked to remove organic materials from the layer (step 108). Preferably, the $SiO_2$ layer is heated to a temperature of about 300° C. to about 600° C. for about 30 minutes to about 2 hours. The $SiO_2$ layer then is sintered by heating it, preferably to a temperature of about 600° C. to about 1200° C. for about 30 minutes to about 8 hours (step 110). In another exemplary embodiment, the silica also may be deposited using CVD, PVD or EB-PVD.

Figure 7:
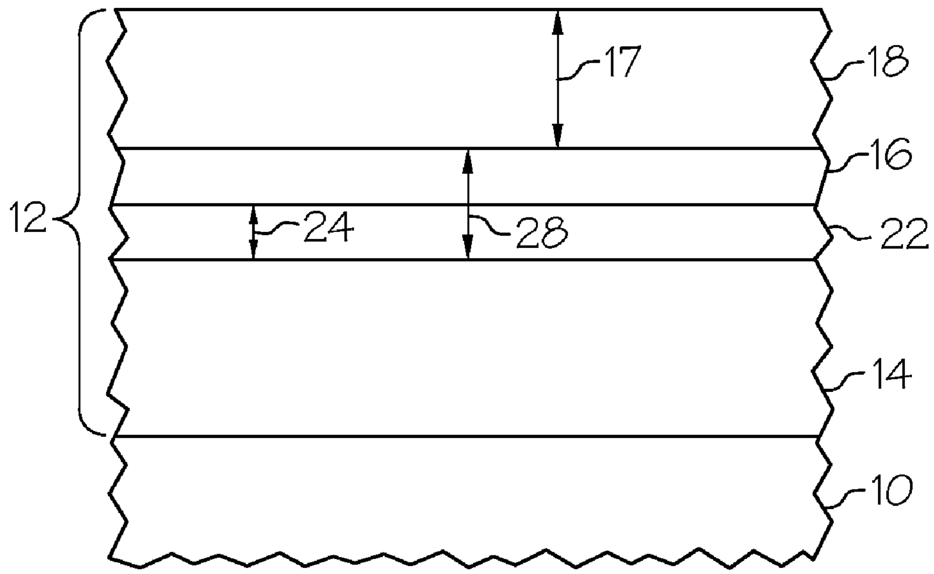
FIG. 7 is a cross-sectional view of a silicon dioxide layer and a barrier layer disposed between a bond coating and a thermal barrier coating, in accordance with an exemplary embodiment of the method of FIG. 4.
Figure 8:
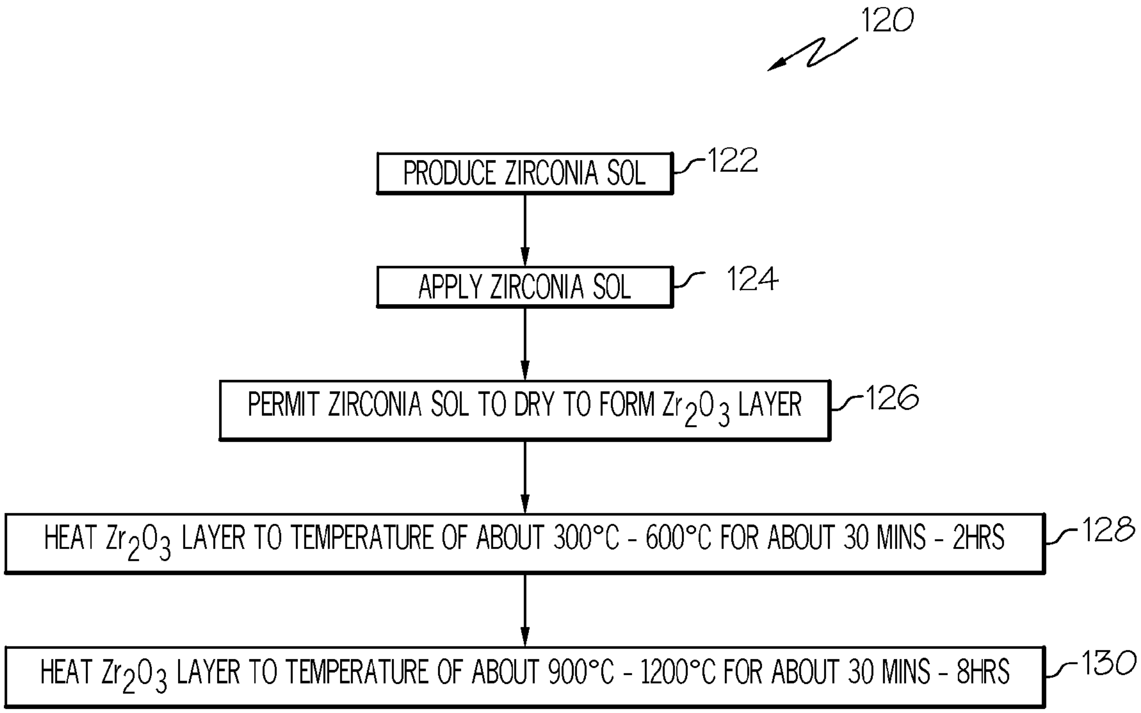
FIG. 8 is a flowchart of a method for fabricating a barrier layer of FIG. 7, in accordance with an exemplary embodiment of the present invention.

Referring back to FIG. 4, and momentarily to FIG. 7, in an optional embodiment of the present invention, before formation of the $SiO_2$ layer 16, a barrier layer 22 can be formed on the bond coating (step 58). The barrier layer 22 minimizes the preferential reaction of the $SiO_2$ layer 16 with alumina of the bond coating 14 relative to the thermal barrier coating 18. In an exemplary embodiment of the invention, the barrier layer comprises zirconium oxide ($Zr_2O_3$). In accordance with one exemplary embodiment, the $Zr_2O_3$ layer may be deposited using CVD, PVD, or EB-PVD. In another exemplary embodiment, the $Zr_2O_3$ layer is formed using a sol-gel process. A method 120 for producing a $Zr_2O_3$ layer using a sol-gel process is illustrated in FIG. 8. Referring momentarily to FIG. 8, method 120 begins by mixing a zirconium alkoxide, such as zirconium 2-ethylhexanoate, with an anhydrous solvent, such as alcohol, to produce a zirconia sol (step 122). The sol is applied to the bond coating using any suitable technique, such as spraying, painting, dip-coating or the like, so that a layer, with minimal or preferably no air bubbles, is disposed on the bond coating (step 124). The zirconia sol is permitted to dry at a temperature in the range of about 4° C. to about 70° C. in an environment of about 10 to about 90% humidity, thereby forming a $Zr_2O_3$ layer overlying the bond coating (step 126). Once dried, the $Zr_2O_3$ layer is baked to remove organic materials from the layer (step 128). Preferably, the $Zr_2O_3$ layer is heated to a temperature of about 300° C. to about 600° C. for about 30 minutes to about 2 hours. The $Zr_2O_3$ layer then is sintered by heating it, preferably to a temperature of about 900° C. to about 1200° C. for about 30 minutes to about 8 hours (step 130). In another exemplary embodiment, the sintering steps of the $Zr_2O_3$ layer and the $SiO_2$ layer are combined. In this regard, the $SiO_2$ layer is deposited on the $Zr_2O_3$ layer after the $Zr_2O_3$ layer is baked but before it is sintered. Then, once the $SiO_2$ layer is formed on the $Zr_2O_3$ layer and baked, both layers can be sintered at a temperature in the range of about 900° C. to about 1200° C. for about 30 minutes to about 8 hours. In one embodiment, the barrier layer 22 has a thickness, indicated by double-headed arrow 24, that is no greater than about 12 μm (about 0.4 mil). Preferably, the thickness is about 1 μm (about 0.04 mil). In another exemplary embodiment, the barrier layer 22 and the $SiO_2$ layer 16 have a combined thickness, indicated by double-headed arrow 28, that is no greater than about 25 μm (about 1 mils).

Referring back to FIG. 4, once the $SiO_2$ layer is formed overlying the bond coating, with (FIG. 7) or without (FIG. 5) the barrier layer 22 disposed therebetween, a thermal barrier coating, such as thermal barrier coating 18 of FIG. 2, is formed on the $SiO_2$ layer (step 60). The thermal barrier coating can be formed of the same materials in the same manner as described above with reference to step 38 of FIG. 3. As described above, the thermal barrier coating is heated, preferably to a temperature in the range of about 900° C. to about 1100° C. for about 0.5 to 12 hours (step 62). In this regard, the $SiO_2$ layer reacts with the thermal barrier coating to form a silicate layer, such as silicate layer 13 of FIG. 2. For example, the $SiO_2$ layer can react with a thermal barrier coating comprising YSZ to form zirconium silicate ($ZrSiO_4$) or the $SiO_2$ layer can react with a thermal barrier coating comprising YSH to form hafnium silicate ($HfSiO_4$). The $SiO_2$ layer also reacts with the alumina of the bond coating. As noted above, the silicate layer 13 inhibits the oxidation of the alumina and hence the bond coating and strongly bonds the thermal barrier coating to the bond coating, thus minimizing failure of the thermal bond coating. Preferably, all of the $SiO_2$ layer reacts with the thermal barrier coating 18 and the bond coating 14, although it will be understood that some unreacted $SiO_2$ may remain in the silicate layer 13. If the barrier layer 22 is present during heating of the thermal barrier coating 18, the barrier layer also contributes to formation of the silicate layer 13. Preferably, all of the $SiO_2$ layer and $Zr_2O_3$ layer react, although it will be understood that some unreacted $SiO_2$ and $Zr_2O_3$ may remain in the silicate layer 13. While the above description indicates that the $SiO_2$ layer and, if present, the $Zr_2O_3$ layer are sintered before formation of the thermal barrier coating, sintering of the $SiO_2$ layer and the $ZrO_2$ layer can be postponed until after the thermal barrier coating layer is formed. In this regard, the $SiO_2$ layer and the thermal barrier coating 18, or all three layers if the barrier layer is present, then can be simultaneously heated to a temperature in the range of about 900° C. to about 1100° C. for about 0.5 to 12 hours to produce the silicate layer 13.

Figure 9:
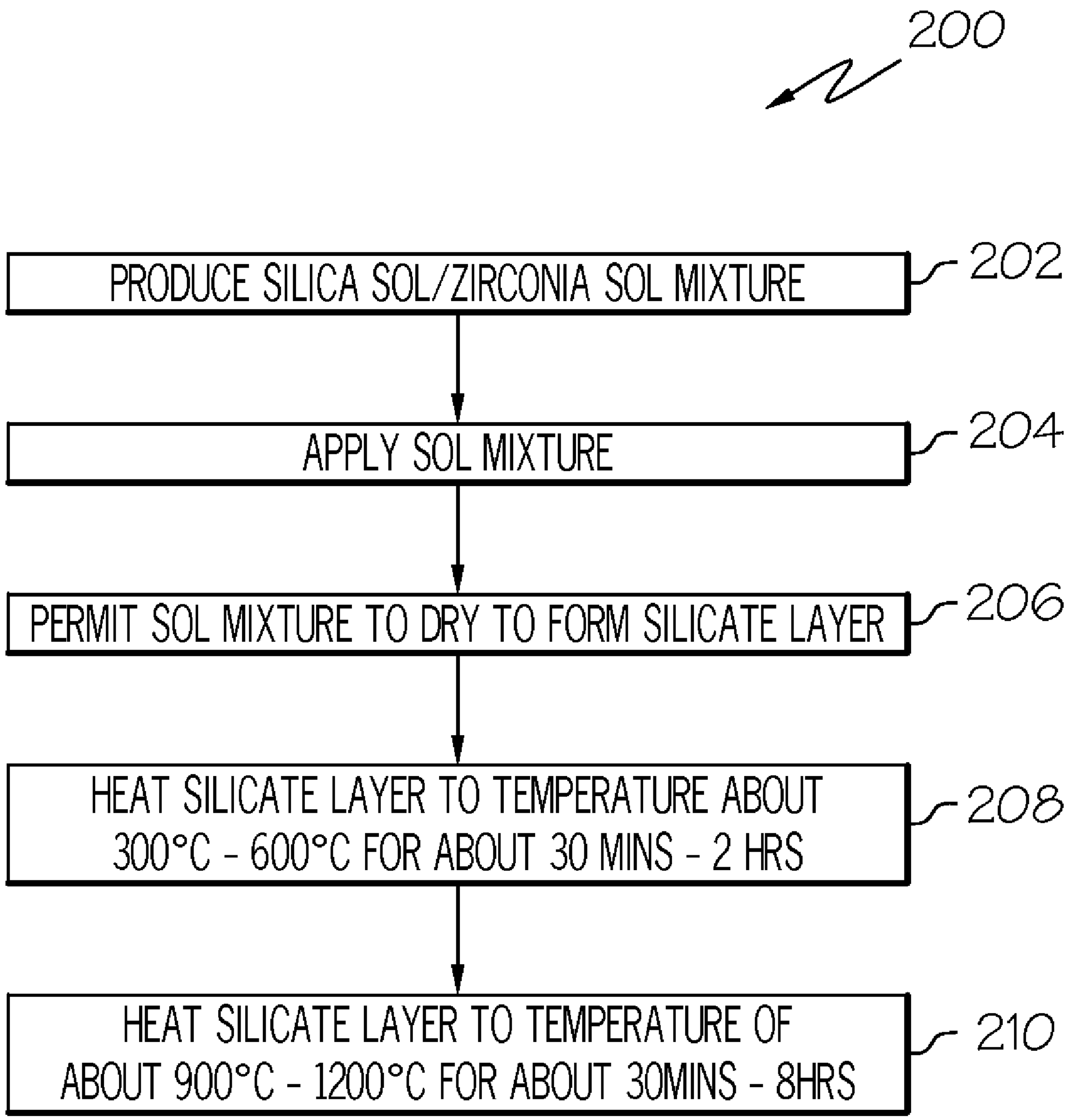
FIG. 9 is a flowchart of a method for fabricating the silicate layer of FIG. 2, in accordance with an exemplary embodiment of the present invention.

Referring to FIG. 9, in another exemplary embodiment, steps 58 and 56 of FIG. 4 effectively can be combined into a method 200 that begins with the mixing of the liquid silica and zirconia sols to form a sol mixture (step 202). In a preferred embodiment, the silica and zirconia sols are mixed in a silica sol/zirconia sol ratio of about 0.3 to about 0.7. The resultant sol mixture is applied to the bond coating using any of the techniques described above for application of the silica sol (step 204). The sol mixture is permitted to dry at a temperature in the range of about 4° C. to about 70° C. in an environment of about 10 to about 90% humidity to form a zirconium silicate layer (step 206). Once dried, the silicate layer is baked to remove organic materials from the layer (step 208). Preferably, the silicate layer is heated to a temperature of about 300° C. to about 600° C. for about 30 minutes to about 2 hours. The zirconium silicate layer then is sintered by heating it, preferably to a temperature of about 900° C. to about 1200° C. for about 30 minutes to about 8 hours (step 210). The thermal barrier coating then may be formed on the zirconium silicate layer as described above with reference to FIG. 4.

Accordingly, protective coating systems for gas turbine engine applications and methods for fabricating such protective coating systems have been provided. The protective coating systems utilize a silicate layer between a bond coating and a thermal barrier coating to improve the bonding therebetween. The silicate layer may be deposited using vapor deposition techniques or may be formed using a $SiO_2$ layer and an optional barrier layer. The barrier layer minimizes the preferential reaction of the $SiO_2$ layer with the alumina of the bond coating. Accordingly, the protective coating systems exhibit both thermal barrier properties and long life.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method of fabricating a protective coating system on a substrate, the method comprising:

forming an aluminide-comprising bond coating on the substrate;

forming a silicate layer on the bond coating;

forming a thermal barrier coating overlying the silicate layer; and heating the thermal barrier coating before use at a temperature and for a time sufficient for the silicate layer to react with the thermal barrier coating and the bond coating.

2. The method of claim 1, wherein the step of forming a silicate layer comprises forming a silicon dioxide layer or a zirconium silicate layer on the bond coating using CVD, PVD, or EB-PVD.

3. The method of claim 1, wherein the step of forming a silicate layer comprises:

forming a silicon dioxide layer overlying the bond coating; and heating the substrate to a temperature in the range of about 600° C. to about 1200° C. for about 30 minutes to about 8 hours.

4. The method of claim 3, wherein the step of forming the silicon dioxide layer comprises the steps of:

forming a silica sol;

applying the silica sol overlying the bond coating;

permitting the silica sol to dry; and heating the substrate to a temperature in the range of about 300° C. to about 600° C. for about 30 minutes to about 2 hours.

5. The method of claim 3, further comprising, before the step of forming the silicon dioxide layer, the step of forming a barrier layer on the bond coating.

6. The method of claim 5, wherein the step of forming the barrier layer comprises the step of forming a zirconium oxide layer on the bond coating.

7. The method of claim 6, wherein the step of forming the zirconium oxide layer comprises the steps of:

forming a zirconia sol;

applying the zirconia sol to the bond coating; and permitting the zirconia sol to dry.

8. The method of claim 7, further comprising, after the step of permitting the zirconia sol to dry, the steps of:

heating the zirconium oxide layer to a temperature in the range of about 300° C. to about 600° C. for about 30 minutes to about 2 hours; and heating the zirconium oxide layer to a temperature in the range of about 900° C. to about 1200° C. for about 30 minutes to about 8 hours.

9. The method of claim 8, wherein the steps of heating the substrate to a temperature in the range of about 600° C. to about 1200° C. for about 30 minutes to about 8 hours and heating the zirconium oxide layer to a temperature in the range of about 900° C. to about 1200° C. for about 30 minutes to about 8 hours are performed simultaneously at a temperature in the range of about 900° C. to about 1200° C. for about 30 minutes to about 8 hours.

10. The method of claim 9, wherein the step of heating the thermal barrier coating comprises the step of heating the thermal barrier coating to a temperature in the range of about 900° C. to about 1100° C. for about 0.5 to about 12 hours.

11. The method of claim 10, wherein the step of heating the substrate to a temperature in the range of about 600° C. to about 1200° C. for about 30 minutes to about 8 hours, the step of heating the zirconium oxide layer to a temperature in the range of about 900° C. to about 1200° C. for about 30 minutes to about 8 hours, and the step of heating the thermal barrier coating to a temperature in the range of about 900° C. to about 1100° C. for about 0.5 to about 12 hours are performed simultaneously at a temperature in the range of about 900° C. to about 1100° C. for about 0.5 to about 12 hours.

12. The method of claim 1, wherein the step of heating the thermal barrier coating comprises the step of heating the thermal barrier coating to a temperature in the range of about 900° C. to about 1100° C. for about 0.5 to about 12 hours.

13. The method of claim 1, wherein the step of forming a silicate layer comprises the steps of:

forming a silicon sol/zirconia sol mixture to form a sol mixture;

applying the sol mixture overlying the bond coating;

permitting the silica sol/zirconia sol mixture to dry;

heating the substrate to a temperature in the range of about 300° C. to about 600° C. for about 30 minutes to about 2 hours; and heating the substrate to a temperature in the range of about 900° C. to about 1200° C. for about 30 minutes to about 8 hours.

14. The method of claim 1, wherein the step of forming a silicate layer comprises the step of forming a silicate layer that is less than about 5 μm.

15. The method of claim 1, wherein the step of forming an aluminide-comprising bond coating on the substrate comprises the step of forming the aluminide-comprising bond coating on a nickel-based superalloy.

16. A method of fabricating a protective coating system on a substrate, the method comprising:

forming an aluminide-comprising bond coating on the substrate;

forming a silicon dioxide layer overlying the bond coating;

depositing a thermal barrier coating on the silicon dioxide layer; and heating the substrate so that the silicon dioxide layer forms a silicate layer disposed between the bond coating and the thermal barrier coating, wherein the step of heating is performed after the step of depositing.

17. The method of claim 16, wherein the step of forming the silicon dioxide layer comprises the steps of:

forming a silica sol;

applying the silica sol overlying the bond coating;

permitting the silica sol to dry;

heating the substrate to a temperature in the range of about 300° C. to about 600° C. for about 30 minutes to about 2 hours; and heating the substrate to a temperature in the range of about 600° C. to about 1200° C. for about 30 minutes to about 8 hours.

18. The method of claim 16, further comprising, before the step of forming a silicon dioxide layer, the step of forming a barrier layer on the bond coating.

19. The method of claim 18, wherein the step of forming the barrier layer comprises the step of:

forming a zirconia sol;

applying the zirconia sol to the bond coating;

permitting the zirconia sol to dry to form a zirconium oxide;

heating the substrate to a temperature in the range of about 300° C. to about 600° C. for about 30 minutes to about 2 hours; and heating the substrate to a temperature in the range of about 900° C. to about 1200° C. for about 30 minutes to about 8 hours.

* * * * *